(12) United States Patent
Daniel

(10) Patent No.: US 9,450,601 B1
(45) Date of Patent: Sep. 20, 2016

(54) CONTINUOUS ROUNDING OF DIFFERING BIT LENGTHS

(71) Applicant: Microsoft Technology Licensing, LLC, Redmond, WA (US)

(72) Inventor: Andrew David Daniel, Palo Alto, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/677,583

(22) Filed: Apr. 2, 2015

(51) Int. Cl.
*H03M 7/00* (2006.01)
*H03M 7/02* (2006.01)

(52) U.S. Cl.
CPC ............... *H03M 7/02* (2013.01); *H03M 7/005* (2013.01)

(58) Field of Classification Search
CPC ............................... H03M 7/02; H03M 7/005
USPC ...................... 341/50, 52, 59, 60, 61, 65, 67
See application file for complete search history.

(56) References Cited

U.S. PATENT DOCUMENTS

| | | | |
|---|---|---|---|
| 4,229,800 A | 10/1980 | Gregorian et al. | |
| 4,463,377 A * | 7/1984 | Meyer-Ebrecht | H04N 19/60 341/87 |
| 4,750,146 A | 6/1988 | Dalqvist et al. | |
| 4,903,301 A * | 2/1990 | Kondo | G10L 19/06 375/240 |
| 5,113,486 A | 5/1992 | Luttmer | |
| 5,258,943 A | 11/1993 | Gamez et al. | |
| 6,384,838 B1 | 5/2002 | Hannah | |
| 6,560,623 B1 | 5/2003 | Smith | |
| 6,768,980 B1 | 7/2004 | Meyer et al. | |
| 6,898,614 B2 | 5/2005 | Birru et al. | |
| 7,577,699 B2 | 8/2009 | Denk et al. | |
| 7,822,799 B1 | 10/2010 | Langhammer et al. | |
| 2005/0015247 A1 * | 1/2005 | Sakuyama | G10L 19/0216 704/229 |
| 2006/0233446 A1 * | 10/2006 | Saito | H04N 19/176 382/232 |
| 2007/0053420 A1 | 3/2007 | Koyanagi | |
| 2011/0200327 A1 | 8/2011 | Qi et al. | |
| 2012/0254190 A1 * | 10/2012 | Kataoka | G06F 17/30619 707/741 |
| 2013/0124588 A1 | 5/2013 | Kroener et al. | |
| 2014/0229484 A1 * | 8/2014 | Kataoka | G06F 17/30613 707/737 |

FOREIGN PATENT DOCUMENTS

WO          943988 A2     2/1994

OTHER PUBLICATIONS

Popat, et al., "Two-Stage Lossy/Lossless Compression of Grayscale Document Images", In Proceedings of the Fifth International Symposium on Mathematical Morphology, Jun. 26, 2000, 10 pages.

Kornerup, et al., "Performing Arithmetic Operations on Round-to-Nearest Representations", In the Transactions on Computers, vol. 60, Issue No. 2, IEEE, Feb. 1, 2011, pp. 282-291.

(Continued)

*Primary Examiner* — Peguy Jean Pierre
(74) *Attorney, Agent, or Firm* — Gregg Wisdom; Judy Yee; Micky Minhas

(57) ABSTRACT

A system and method are disclosed for encoding numbers in a way that improves the accuracy and efficiency of one or more computing devices working with the transmitted/stored encoded numbers. When the encoded value is missing one or more bits after transmission or storage, the remaining bits of the encoded value will be optimally rounded up or down for the number of bits actually received.

30 Claims, 11 Drawing Sheets

(Step 200)

(56) References Cited

OTHER PUBLICATIONS

Kornerup, et al., "RN-Coding of Numbers: Definition and Some Properties", Retrieved from: <<http://perso.ensyon.fr/jean-michel.muller/RN-recodings-IMACS.pdf>>, Jan. 1, 2004, 6 pages.

Kornerup, P., "RN-Codings: New Insights and Some Applications", Retrieved from: <<http://www.imada.sdu.dk/-kornerup/papers/rnc-RN.pdf>>, Jan. 1, 2006, pp. 1-8.

"International Search Report and Written Opinion Issued in PCT Application No. PCT/US2016/024405", Mailed Date: Jun. 13, 2016, 11 pages. (MS# 356639.02).

* cited by examiner

Fig. 1

| Integer | Binary |
|---|---|
| 0: | 0000 |
| 1: | 0001 |
| 2: | 0010 |
| 3: | 0011 |
| 4: | 0100 |
| 5: | 0101 |
| 6: | 0110 |
| 7: | 0111 |
| 8: | 1000 |
| 9: | 1001 |
| 10: | 1010 |
| 11: | 1011 |
| 12: | 1100 |
| 13: | 1101 |
| 14: | 1110 |
| 15: | 1111 |

Fig. 2

| Bit | Value if 0 | Value if 1 | Value closest to "5" |
|---|---|---|---|
| 1st | 0xxxx = 0 | 1xxxxx = +16 = 16 | 0 (0xxxxx) |
| 2nd | 00xxx = 0 | 01xxxx = +8 = 8 | 8 (01xxx) |
| 3rd | 010xx = +8 = 8 | 011xx = +8−4 = 4 | 4 (011xx) |
| 4th | 0110x = +8-4 = 4 | 0111x = +8−4+2 = 6 | 4 & 6 are equally close |
| 5th (if 0110x selected) | 01100 = +8-4 = 4 | 01101 = +8-4+1 = 5 | 5 (01101) |
| 5th (if 0111x selected) | 01110 = +8-4+2 = 6 | 01111 = +8-4+2-1 = 5 | 5 (01111) |

(Step 200)

Fig. 6

| Integer | Binary | Equation | CR Value |
|---|---|---|---|
| 0: | 0000 | 0 = 0 | 00000 |
| 1: | 0001 | +2 − 1 = 1 | 00011 |
| 2: | 0010 | +4 − 2 = 2 | 00110 |
| 3: | 0011 | +4 − 1 = 3 | 00101 |
| 4: | 0100 | +8 − 4 = 4 | 01100 |
| 5: | 0101 | +8 − 4 +2 − 1 = 5 | 01111 |
| 6: | 0110 | +8 − 2 = 6 | 01010 |
| 7: | 0111 | +8 − 1 = 7 | 01001 |
| 8: | 1000 | +16 − 8 = 8 | 11000 |
| 9: | 1001 | +16 − 8 + 2 − 1 = 9 | 11011 |
| 10: | 1010 | +16 − 8 + 4 − 2 = 10 | 11110 |
| 11: | 1011 | +16 − 8 + 4 − 1 = 11 | 11101 |
| 12: | 1100 | +16 − 4 = 12 | 10100 |
| 13: | 1101 | +16 − 4 + 2 − 1 = 13 | 10111 |
| 14: | 1110 | +16 − 2 =14 | 10010 |
| 15: | 1111 | +16 − 1 = 15 | 10001 |
| 25: | 11001 | | 101011 |
| 37: | 100101 | | 1101111 |
| 73: | 1001001 | | 11011011 |

Fig. 8

| Integer | Binary | CR Value | Truncated CR Value | Derived Low Order Bit |
|---|---|---|---|---|
| 0: | 0000 | 00000 | 0000 | 0 |
| 1: | 0001 | 00011 | 0001 | 1 |
| 2: | 0010 | 00110 | 0011 | 0 |
| 3: | 0011 | 00101 | 0010 | 1 |
| 4: | 0100 | 01100 | 0110 | 0 |
| 5: | 0101 | 01111 | 0111 | 1 |
| 6: | 0110 | 01010 | 0101 | 0 |
| 7: | 0111 | 01001 | 0100 | 1 |
| 8: | 1000 | 11000 | 1100 | 0 |
| 9: | 1001 | 11011 | 1101 | 1 |
| 10: | 1010 | 11110 | 1111 | 0 |
| 11: | 1011 | 11101 | 1110 | 1 |
| 12: | 1100 | 10100 | 1010 | 0 |
| 13: | 1101 | 10111 | 1011 | 1 |
| 14: | 1110 | 10010 | 1001 | 0 |
| 15: | 1111 | 10001 | 1000 | 1 |
| 25: | 11001 | 101011 | 10101 | 1 |
| 37: | 100101 | 1101111 | 110111 | 1 |
| 73: | 1001001 | 11011011 | 1101101 | 1 |

Fig. 11

| Truncated C Value | Binary D Value | Integer |
|---|---|---|
| 0000 | 0000 | 0 |
| 0001 | 0001 | 1 |
| 0010 | 0011 | 3 |
| 0011 | 0010 | 2 |
| 0100 | 0111 | 7 |
| 0101 | 0110 | 6 |
| 0110 | 0100 | 4 |
| 0111 | 0101 | 5 |
| 1000 | 1111 | 15 |
| 1001 | 1110 | 14 |
| 1010 | 1100 | 12 |
| 1011 | 1101 | 13 |
| 1100 | 1000 | 8 |
| 1101 | 1001 | 9 |
| 1110 | 1011 | 11 |
| 1111 | 1010 | 10 |
| 10101 | 11001 | 25 |
| 110111 | 100101 | 37 |
| 1101101 | 1001001 | 73 |

Fig. 12

| Integer | Binary | Standard C Value | Equation | Alternate C Value | Alternate Equation |
|---|---|---|---|---|---|
| 0: | 0000 | 00000 | 0 = 0 | | |
| 1: | 0001 | 00011 | +2 - 1 = 1 | 00001 | +1 = 1 |
| 2: | 0010 | 00110 | +4 - 2 = 2 | 00010 | +2 = 2 |
| 3: | 0011 | 00101 | +4 - 1 = 3 | 00111 | +4 - 2 + 1 = 3 |
| 4: | 0100 | 01100 | +8 - 4 = 4 | 00100 | +4 = 4 |
| 5: | 0101 | 01111 | +8 - 4 + 2 - 1 = 5 | 01101 | +8 - 4 + 1 = 5 |
| 6: | 0110 | 01010 | +8 - 2 = 6 | 01110 | +8 - 4 + 2 = 6 |
| 7: | 0111 | 01001 | +8 - 1 = 7 | 01011 | +8 - 2 + 1 = 7 |
| 8: | 1000 | 11000 | +16 - 8 = 8 | 01000 | +8 = 8 |
| 9: | 1001 | 11011 | +16 - 8 + 2 - 1 = 9 | 11001 | +16 - 8 + 1 = 9 |
| 10: | 1010 | 11110 | +16 - 8 + 4 - 2 = 10 | 11010 | +16 - 8 + 2 = 10 |
| 11: | 1011 | 11101 | +16 - 8 + 4 - 1 = 11 | 11111 | +16 - 8 + 4 - 2 + 1 = 11 |
| 12: | 1100 | 10100 | +16 - 4 = 12 | 11100 | +16 - 8 + 4 = 12 |
| 13: | 1101 | 10111 | +16 - 4 + 2 - 1 = 13 | 10101 | +16 - 4 + 1 = 13 |
| 14: | 1110 | 10010 | +16 - 2 = 14 | 10110 | +16 - 4 + 2 = 14 |
| 15: | 1111 | 10001 | +16 - 1 = 15 | 10011 | +16 - 2 + 1 = 15 |

CONTINUOUS ROUNDING OF DIFFERING BIT LENGTHS

BACKGROUND

When a binary value is truncated due to a transmission error, storage requirement, or because a coarse value is desired, the result may or may not represent a correctly rounded value. For example, the binary stream 1100.1101 can be truncated to 6 bits as 1100.11 which is the correctly rounded value of the original data. However if the stream is truncated to 4 bits, the result 1100 is not a properly rounded value. This value incorrectly rounds down (last bit is a 0), whereas the rounded up value, 1101, is closer to the original data. Although it is easy to round correctly to any bit precision, it is only possible to do so if the required bit precision is known in advance.

SUMMARY

Embodiments of the present technology relate to a system and method for encoding and decoding binary numbers in a way which improves the accuracy and efficiency of one or more computing devices working with the decoded binary numbers. In particular, encoding and decoding of a binary number will result in the same binary number before and after encoding/decoding when a complete encoded value is transmitted and/or stored. Additionally, it may happen that less than all bits of the encoded value are transmitted or stored, for example due to transmission error, storage requirement, or because a coarse preview of the data in advance of the full number is desired. In this instant, given one or more missing bits in the encoded value, the encoded value will correctly round up or down upon decode to most accurately reflect the original binary number which was encoded.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 1 is a table of non-negative integer values and the corresponding binary values which may be represented by 4 bits.

FIG. 2 is a table conceptually illustrating encoding of a sample integer number 5 in accordance with aspects of the present technology.

FIG. 6 is a table illustrating resulting encoded values for a number of binary inputs.

FIG. 8 is a table illustrating resulting encoded values and truncated encoded values for a number of binary inputs.

FIG. 11 is a table illustrating encoded values and the corresponding binary number obtained upon decode of the encoded values.

FIG. 12 is a table illustrating standard and alternative encoded values obtained according to embodiments of the present technology.

DETAILED DESCRIPTION

Figure 3:
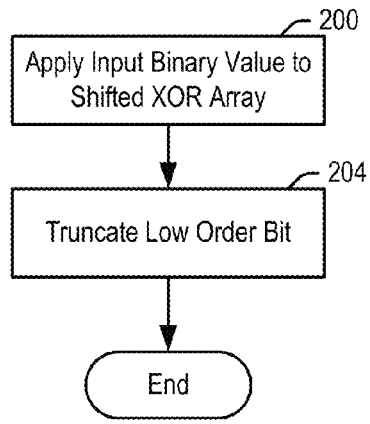
FIG. 3 is a flowchart illustrating an encoding portion of a continuous rounding routine in accordance with aspects of the present technology.

Embodiments of the present technology will now be described with reference to the figures, which in embodiments relate to a method of encoding numbers using a continuous rounding routine. The continuous rounding routine which will result in the correct value when all bits of the encoded number are received, and will result in the optimally rounded value when less than all of the bits of the encoded number are received. The algorithm rounds the transmitted value to a number which most closely approximates the original correct value for the bits that are transmitted, regardless of how many of the bits of the original value are transmitted. The continuous rounding routine employs a sequentially alternating sign (+/−) in encoding a binary value as explained below.

Transmission of values encoded by the continuous rounding routine of the present technology improves the efficiency and accuracy of computing devices working with the transmitted values. For example, the present technology prevents computing systems from working with a rounded up value in the event less than all of the bits of an original number are received, when the rounded up value would more closely approximate the original number.

As will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely in hardware, entirely in software (including firmware, resident software, micro-code, etc.) or combining software and hardware implementations that may all generally be referred to herein as a "routine." Furthermore, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. A computer readable storage medium does not include transitory, modulated or other types of signals Computer program code for carrying out operations for aspects of the present disclosure may be written in any combination of one or more programming languages, including an object oriented programming language such as Java, Scala, Smalltalk, Eiffel, JADE, Emerald, C++, CII, VB.NET, Python or the like, conventional procedural programming languages, such as the "c" programming language, Visual Basic, Fortran 2003, Perl, COBOL 2002, PHP, ABAP, dynamic programming languages such as Python, Ruby and Groovy, or other programming languages. The program code may execute on a client device of a user, a computing system remote from a user such as a centralized server, or partly on the client device and partly on the centralized server. The centralized server may be connected to the user's client device through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, processor other programmable data processing apparatus, or other devices to function in a particular manner, such that the instructions when stored in the computer readable medium produce an article of manufacture including instructions which when executed, cause a computer or processor to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process. In this event, the instructions which execute on the computer or other programmable apparatus provide processes for implementing the functions/acts specified in the flowchart and/or block diagram block or blocks.

In accordance with aspects of the present technology, binary values to be transmitted may first be encoded using an encoding sequence of the continuous rounding routine. Once transmitted, the received encoded value may be decoded using a decoding sequence of the continuous rounding routine. In order to explain the continuous rounding routine, standard 4-bit unsigned binary numbers ranging between 0 and 15 are examined with reference to FIG. 1. A standard binary number represents a sum of different powers of 2, in which a "1" bit specifies the power of 2 is added to the sum, and a "0" bit specifies that it is not added to the sum. There is a single manner in which any decimal integer may be expressed as a binary value. For example:

$$5=0101(binary)=2^2+2^0=4+1 \qquad (Eq.\ 1)$$

$$11=1011(binary)=2^3+2^1+2^0=8+2+1 \qquad (Eq.\ 2)$$

$$15=1111(binary)=2^3+2^2+2^1+2^0=8+4+2+1 \qquad (Eq.\ 3)$$

However, in accordance with aspects of the present technology, powers of two may also be subtracted. This provides more than one way to arrive at a desired integer sum of powers of 2. For example, the decimal number 5 could be expressed as any of the following:

$$5=2^3-2^2+2^0=8-4+1 \qquad (Eq.\ 4)$$

$$5=2^3-2^2+2^1-2^0=8-4+2-1 \qquad (Eq.\ 5)$$

$$5=2^3-2^1-2^0=8-2-1 \qquad (Eq.\ 6)$$

$$5=2^2+2^1-2^0=4+2-1 \qquad (Eq.\ 7)$$

Equations 4-7 share the property of the original binary sum (Equations 1-3) that each power of 2 may be added to the final sum or not, but may only be added once. Equations 4 and 5 also have the additional property that the sign bits alternate along the equation, causing the intermediate sum to "zero in" on the target result. Each successive power of 2 added or subtracted gets closer to the actual value (or at least does not get farther away). By contrast, in conventional binary the intermediate sums monotonically increase to "reach" the target result. The continuous rounding routine uses the feature of Equations 4 and 5 of alternatingly adding powers of 2 and subtracting powers of 2. Stated another way, the continuous rounding routine alternates the sign (+ or −) when adding powers of 2 to the sum, starting with a positive sign. This also has the benefit that it is not necessary to transmit the sign for each bit.

FIG. 2 illustrates the concept of the continuous rounding routine for best rounding of the integer value of 5 for successive bits received, using alternating signs. In general, as explained below, successive "1" bits in the encoded value, raised to their respective base 10 values, are alternatingly added to and subtracted from the running sum to approach the original base 10 value. FIG. 2 again uses the example of a 4-bit unsigned binary value. However, it is understood that the continuous rounding routine would work for binary values of less than or greater than 4-bits. Where a bit is a "1," 2 to the power of the bit is added to or subtracted from the total sum. Where a bit is "0," nothing is added or subtracted from the total sum.

Referring to the first line of FIG. 2, when the first (highest order) bit is being transmitted, the value of the first bit is best transmitted as a "0." That is because, if the received value of the first bit is "0" (and no other bits have been received), the received value would be "0." If the received value of the first bit is "1" (and no other bits have been received), the received value would 16. 0 is closer than 16 to the original integer 5. Thus, when encoding the integer value 5, the continuous rounding routine would encode the first bit as a "0."

When the second bit is being transmitted, the value of the second bit is best transmitted as a "1." That is because, if the received value of the second bit is "1" (with the first bit already encoded as a "0" as explained above, and no other bits having been received), the received value would be 8. If the received value of the second bit is "0" (with the first bit encoded as a "0," and no other bits have been received), the received value would "0". 8 is closer than "0" to the original integer 5. Thus, when encoding the integer value 5, the continuous rounding routine would encode the second bit as a "1."

When the third bit is being transmitted (with the first two bits already encoded as a "01" as explained above), the value of the third bit is best transmitted as a "1." That is because, if the received value of the third bit is "0," the received value would be 8. If the received value of the third bit is "1" (and no other bits have been received), the received value would 4 (8−4). 4 is closer than 8 to the original integer 5. Thus, when encoding the integer value 5, the continuous rounding routine would encode the third bit as a "1."

When the fourth bit is being transmitted (with the first 3 bits already encoded as "011" as explained above), the value of the fourth bit could be rounded to either a "0" or a "1" under the continuous rounding routine. That is because, if the received value of the fourth bit is "0", the received value would be 4 (8−4). If the received value of the fourth bit is "1," the received value would 6 (8−4+2). 4 and 6 are equidistant from the original integer 5. Thus, when encoding the integer value 5, the continuous rounding routine would encode the third bit as either a "1" or a "0."

If five bits are received (with the first 3 bits encoded as "011," and the fourth bit encoded as either a "1" or a "0," as explained above), the value of the fifth and final bit could be rounded to a "1" according to the continuous rounding routine. That is because, in a first case where the fourth bit is a "0," if the received value of the fifth bit is also "0," the received value would be 4 (8−4). Where the fourth bit is taken as "0," if the received value of the fifth bit is "1," the received value would 5 (8−4+1). 5 is closer than 4 to the original integer 5 (is in fact equal to 5). Thus, in the first case, the fifth bit would be a "1." In second case where the fourth bit is a "1," if the received value of the fifth bit is "0," the received value would be 6 (8−4+2). Where the fourth bit is taken as "1," if the received value of the fifth bit is "1," the received value would 5 (8−4+2−1). 5 is closer than 6 to the original integer 5 (is in fact equal to 5). Thus, in the second case, the fifth bit would also be a "1."

As illustrated in the above discussion, each bit in the transmitted value encoded by the continuous rounding routine rounds correctly to the best approximation of the original integer value. Stated another way, the original binary number is encoded into an encoded value, such that one or more high order bits that remain in the encoded value when one or more lower order bits are omitted always represent a correct rounding of the encoded value up or down to most accurately approximate the original binary number. Thus, should it happen that less than the entire four bits are received, the number of bits received will represent the correct rounding of the number (up or down) to most closely approximate the original integer value.

As also illustrated in the above conceptual discussion of the continuous rounding routine, the algorithm may result in more than one encoded value. In the above example conceptually illustrating the encoding of the integer value 5, the continuous rounding routine returned two possible encoded values: 01101 and 01111. As illustrated below, the continuous rounding routine may be implemented as XOR Boolean logic gates, which produces a first possible encoded value for a given integer which has the property that the number of "1" bits in a complete encoded value sum to an even number. This first possible encoded value is referred to herein as a standard encoded value. However, when implemented by other means, the continuous rounding routine may alternatively produce the second of the two possible encoded values for the given integer which has the property that the number of "1" bits sum to an odd number in a complete encoded value. This second possible encoded value is referred to herein as an alternate encoded value.

Figure 4:
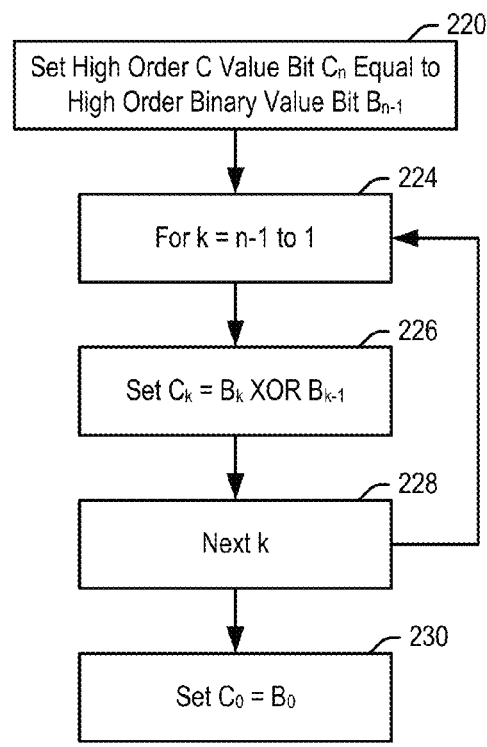
FIG. 4 is a flowchart providing additional detail of step 200 from FIG. 3.
Figure 5:
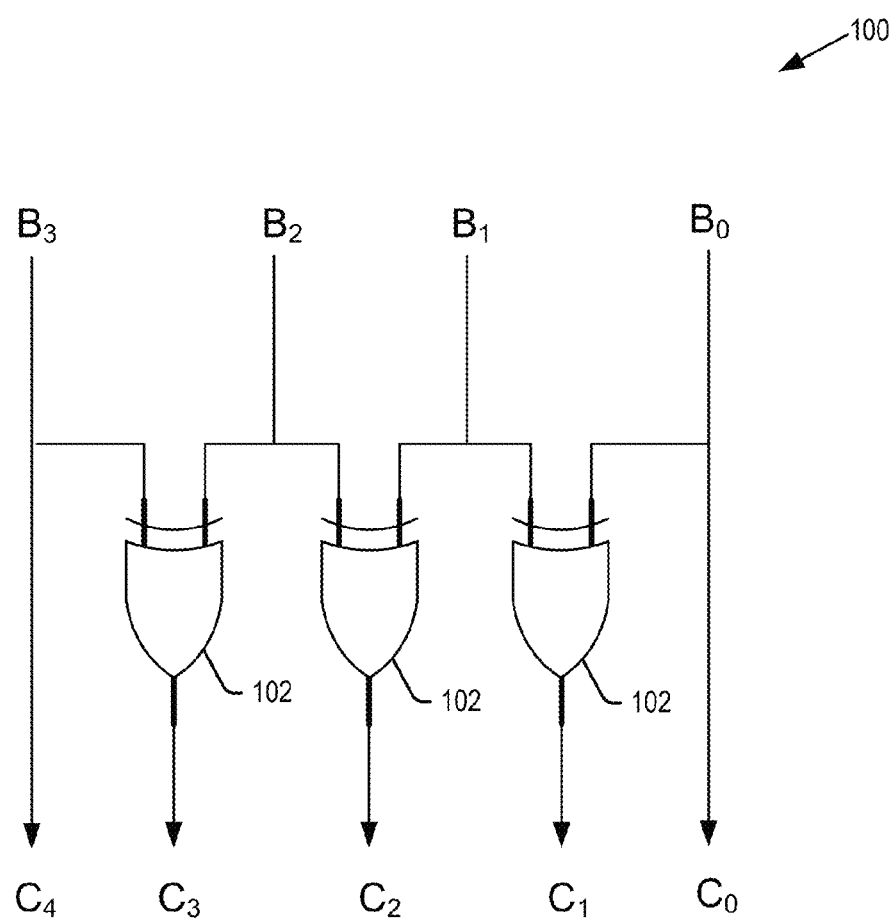
FIG. 5 is an illustration of Boolean logic gates for encoding binary numbers in accordance with aspects of the present technology.

Moving from a conceptual discussion of the continuous rounding routine, a circuit or processor of a computing device may implement the encoding portion of the continuous rounding routine as shown in the flowchart of FIG. 3. In step 200, the original binary value representing the integer is applied to XOR Boolean gates 100 as shown in FIG. 5. Further details of step 200 are shown in the flowchart of FIG. 4. While the example below works with integer values, the continuous rounding routine as described below may be used to encode and decode non-integer values in further embodiments.

The example of FIG. 5 includes three XOR Boolean gates 102 for encoding an original four bit binary number. However, in general, for any n-bit input binary number, B, the XOR Boolean gates 100 may have n−1 XOR Boolean gates. In general, in step 200, the continuous rounding routine takes an n-bit input binary number, B, and outputs an encoded value, C, having n+1 bits. The value C encoded by the XOR Boolean gates 100 is referred to herein as a continuous rounding value. In the following description and accompanying figures, the low order bit of the input B is $B_0$. Thus, the high order bit in an n-bit input B is $B_{n-1}$. Similarly, the low order bit of the encoded value C is $C_0$. Thus, the high order bit in an n+1 bit encoded value C is $C_n$.

In operation, as illustrated below, in the XOR Boolean gates 100, the original input binary number, B, is XORed with a copy of itself that has been shifted by one bit in either direction. Specifically, in step 220, the continuous rounding routine sets the high order bit of the C value equal to the high order bit of the input binary value, B:

$$C_n = B_{n-1} \tag{Eq. 8}$$

In steps 224, 226 and 228, the continuous rounding routine derives the bits of C from $C_{n-1}$ to $C_1$ by providing the bits of B as inputs to the respective XOR gates 102. Specifically, $B_{n-1:1}$ is XORed with $B_{n-2:0}$:

$$C_{n-1:1} = B_{n-1:1} \oplus B_{n-2:0} \tag{Eq. 9}$$

Lastly, in step 230, the continuous rounding routine sets the low order bit of the input binary value, $B_0$, equal to the low order bit of the C value:

$$C_0 = B_0 \tag{Eq. 10}$$

FIG. 6 is a table showing integer values (in this example, 0-15 and some example larger numbers that require more than 4 bits to express), the input binary number B, the alternating-sign equation summing to the integer value, and the encoded C value obtained by the continuous rounding routine. As noted, the C values for input binary numbers of less than or greater than 4 bits may be obtained in the same manner as described above, by subtracting or adding XOR gates to the XOR Boolean gates 100. The table of FIG. 5 has some example larger binary inputs and their encoded C values (the equations for these larger arbitrary binary inputs are omitted). Again, these values are by way of example, and any number of additional binary inputs may be processed as described above.

The method of encoding C values may result in an additional bit per value as compared to the input binary number. For example, a 4-bit code in the range [0,15] permits addends of 16, 8, 4, 2, and 1, which requires 5 bits to encode. However, in further embodiments, the continuous rounding routine may employ a further step that permits transmission using the same number of bits as the input binary number.

Figure 7:
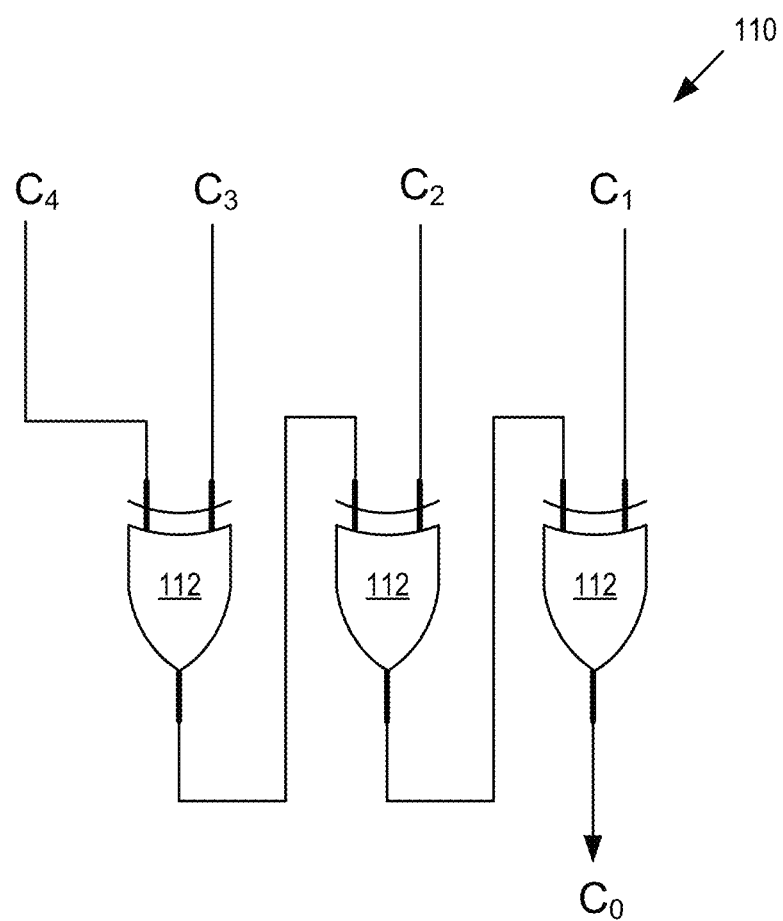
FIG. 7 is an illustration of Boolean logic gates for deriving a low order bit of a value encoded in accordance with aspects of the present technology.

In particular, as can be seen from the tables in FIG. 6, the set of encoded C values generated by the XOR Boolean gates 100 always produces even parity (an even number of 1 bits). (The set of alternate encodings always produce odd parity.) Therefore, the low-order bit of each C value does not need to be transmitted or stored and the transmitted/stored value can be truncated (step 204, FIG. 3). Upon receipt (or any time the full C value is desired), the low order bit can be derived from the XOR of the remaining bits where all bits in the encoded value C have been transmitted. Specifically, remaining bits in the C value may be XORed together to provide the low order bit $C_0$. One possible arrangement of XOR gates 110 for this purpose is shown in FIG. 7. The XOR gates 110 will include one less XOR gates 112 than there are bits in the truncated C value. The example in FIG. 7 shows the derivation of the last bit of a 5-bit C value (earlier truncated to 4 bits) by the 3 XOR gates 112 in step 204.

The truncation of the low order bit allows the C value to be transmitted in the same number of bits as the original binary value. The table of FIG. 8 shows the select integer values, their binary representation, the full C value, the truncated C value and the derived low order bit. In further embodiments, the full length of the C value may be transmitted and/or stored, and used as a parity bit to verify the transmitted/stored C value.

Figure 9:
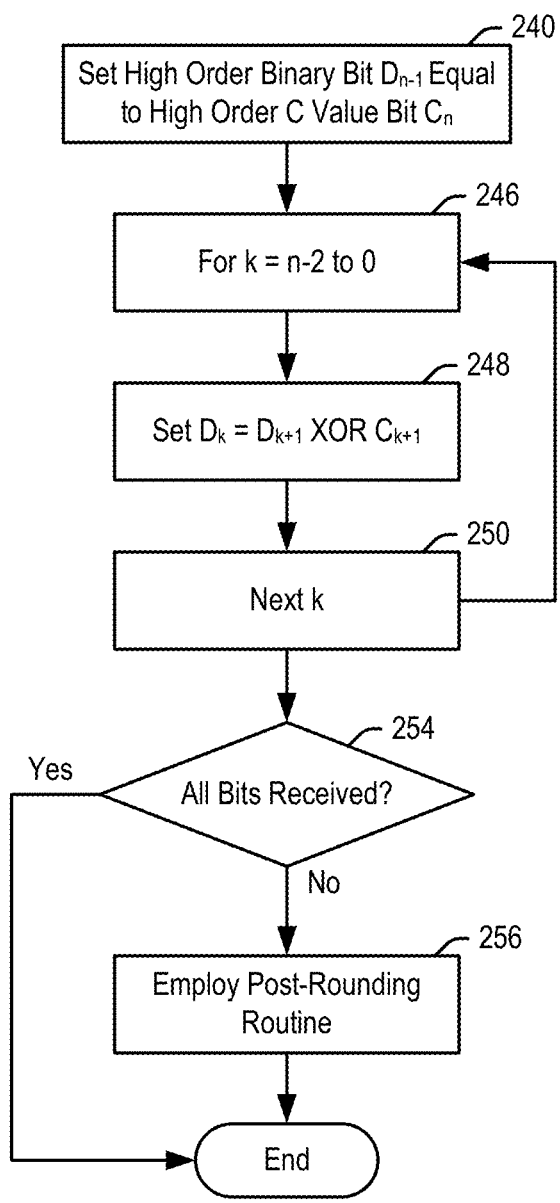
FIG. 9 is a flowchart illustrating a decoding portion of a continuous rounding routine in accordance with aspects of the present technology.
Figure 10:
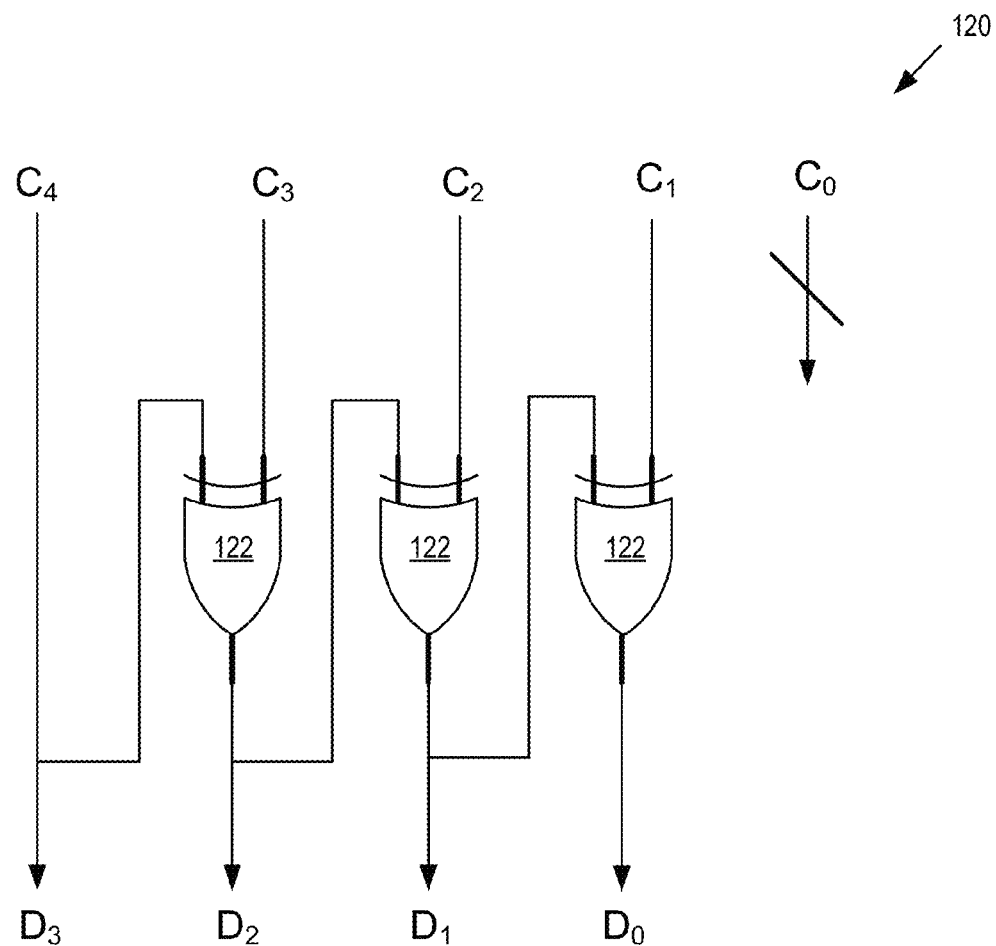
FIG. 10 is an illustration of Boolean logic gates for decoding encoded values in accordance with aspects of the present technology.

Once an encoded C value has been transmitted and/or retrieved from memory, the C value may be decoded as explained with reference to the flowchart of FIG. 9 and XOR gates shown in FIG. 10. In general, the result for output bits consists of the XOR across the bits from the corresponding input through to the highest-order bit. The low order bit $C_0$, representing ±1, which as shown earlier is not required for storage or transmission, is not included in the conversion process. This may be true regardless of whether or not the low order bit was transmitted or stored. In FIG. 10, the remaining bits in the C value are numbered $C_{4:1}$ accordingly.

FIG. 10 shows XOR Boolean gates 120 including XOR gates 122 for decoding C values. In the example shown, there are three XOR gates 122, but there may be more or less gates 122 in further examples having more or less bits in the value C to decode. In embodiments, there may be one less XOR gate 122 than there are bits in a truncated C value.

In step 240, the decoding portion of the continuous rounding routine begins decoding of the C value to a binary value D. Where all bits of the value C have been received and are being decoded, the decoded value D will equal the original binary value B. The decoded value D may be different than the original value B, where for example not all of the bits of the value C were transmitted.

In order to decode the C value, in step 240, the high order bit $D_{n-1}$ may be set to the high order bit $C_n$ in the C value.

$$D_{n-1} = C_n. \qquad \text{(Eq. 11)}$$

Next, in steps 246, 248 and 250, the remaining output binary bits $D_{n-1:0}$ are calculated by a cascaded XORed of bits $C_{n:1}$. For each value "k" from n−2 to 0:

$$D_k = D_{k+1} {}^{\wedge} C_{k+1}. \qquad \text{(Eq. 12)}$$

It should be noted that for the above equation to be valid, "k" is iterated downward, from "n−2" to 0. A table of encoded C values, decoded binary values D and corresponding integer values is set forth in FIG. 11.

The continuous rounding routine described above generates a correctly rounded value for the number of bits received (including any derived low-order bit), whether all or some bits are received. However, where less than all bits are received (step 254, FIG. 9), it is possible to reduce both maximum and average error on decode by a post-rounding routine (step 256).

In a 4-bit example representing positive integers in the range [0,15], it may happen that transmission is interrupted, for example after the first 3 bits. If the 3 bits received are, for example, "101", the value 16−4=12 is the closest rounded value to the actual value for the number of bits received.

Note that this code represents $2^4-2^2=12$, which is guaranteed to be no further from the actual value than the other multiples of $2^2$, namely 8 and 16. Therefore it can be inferred that the actual correct value is in the range [10,14], and the decoded value of 12 is already in the center, with a maximum error of ±2 and an average error (assuming linear distribution) of ±1. However, in this example, the value of 12 was approached from the 16 side (16−4=12) rather than from the 8 side (16−8+4=12). Thus, this indicates that the actual value is also closer to 16 than to 8, and is therefore in the range [12,16]. The intersection of these two ranges results in a final range of [12,14]. Therefore, choosing to decode the incomplete stream "101xx" (including low order bit) as 13 rather than 12 reduces the maximum error to ±1 and the average error to ±½. This can be implemented in hardware or software simply by appending "01" or "11" to the received bits.

Although there are two possible C value encodings for each binary input value, the continuous rounding routine described above generates a single (the same) value in each instance. For example, the value 12 is always encoded as 11100 rather than 10100. However, a value of 11 rather than 13, for example, would encode as 11101 which, when truncated to 3 bits, would in fact generate the "alternate" encoding of 111xx for 12 which would result in a final range of [10,12].

This post-rounding technique also works with non-integer values. For example, if a value is encoded as 4.10 representing the (approximate) range [0.000, 15.999], and a partial stream is received of 10100.1 (a value of 12.500) then it is known that the actual result is in the range [12.250, 12.500]. A decode of 12.375 can then be accomplished by simply appending "01" to 10100.1 and decoding the partial stream 10100.101=16−4+0.5−0.125=12.375.

As noted above, each number (other than zero) can be encoded in two ways: a standard encoding and an alternate encoding. For example, the value 5 can be encoded as 8−4+1 or as 8−4+2−1. Both of these preserve the rule that any intermediate sum cannot be further from the target number than an earlier sum, but in one case there is a "lateral move": 8−4=4 is 1 way from the target of 5, while 8−4+2=6 is the same distance away. The XOR Boolean gates 100 of the continuous rounding routine produce the standard encoded C value. However, in embodiments, the continuous rounding routine may be implemented using routines other than XOR Boolean gates 100. In such embodiments, there may be instances where it is more efficient to use the alternative value for software decoding because it uses less add operations.

The table of FIG. 12 shows integer values (in this example, 0-15), the input binary number B, the standard encoded C value (not truncated), the alternating-sign equation for the standard encoded C value, the alternate encoded C value (not truncated), and the alternating-sign equation for the alternate encoded C value. As shown, there is no alternative C value for integer 0.

As also seen in FIG. 12, the alternate C values all have an odd number of "1" bits. As such, the low order bit may be omitted when the alternate C value is transmitted and/or stored, and may be reconstructed as described above for decoding (assuming all of the bits of C have been received). FIG. 12 also shows that the alternate encoded C values can have more or less "1" bits than the standard encoding.

It is noted that when decoding an encoded value C, the continuous rounding routine uses at least some number of high order bits in the encoded value C to derive the binary value D. However, once a bit in the C value is lost or missing, the bits below the missing bit (lower order than the missing bit) are disregarded, even if present. If one lower-order bit is missing, it may be treated as if the lower-order bit, and all bits below it, are missing.

Encoding binary numbers in to C values as described above provides advantages for the operation of a computing device. A full encoded C value (truncated or not) decodes into an accurate representation of the original binary number from which the C value was obtained. However, it may happen that less than all of an encoded C value is received, for example due to transmission error. Or it may happen that less than all of an encoded C value is stored, due to limited storage space. In these instances, when the shortened C value is decoded, the present technology ensures that the decoded value is properly rounded up or down to most closely approximate the original value. This improves the accuracy, efficiency and functionality of a computing device working with decoded C values in that the computing system will be operating with data that best approximates the original data.

Further, there are instances where only coarse approximations of data are transmitted. For example, when transmitting graphics data, a coarse approximation (some number of higher order bits) may be transmitted to provide a coarse graphic. Thereafter, the remaining low order bits may be transmitted to complete the graphic. In instances where coarse approximations of data are transmitted and/or stored, transmitting and/or storing that data as encoded C values ensures the best rounding and accuracy of the course data approximations.

Figure 13:
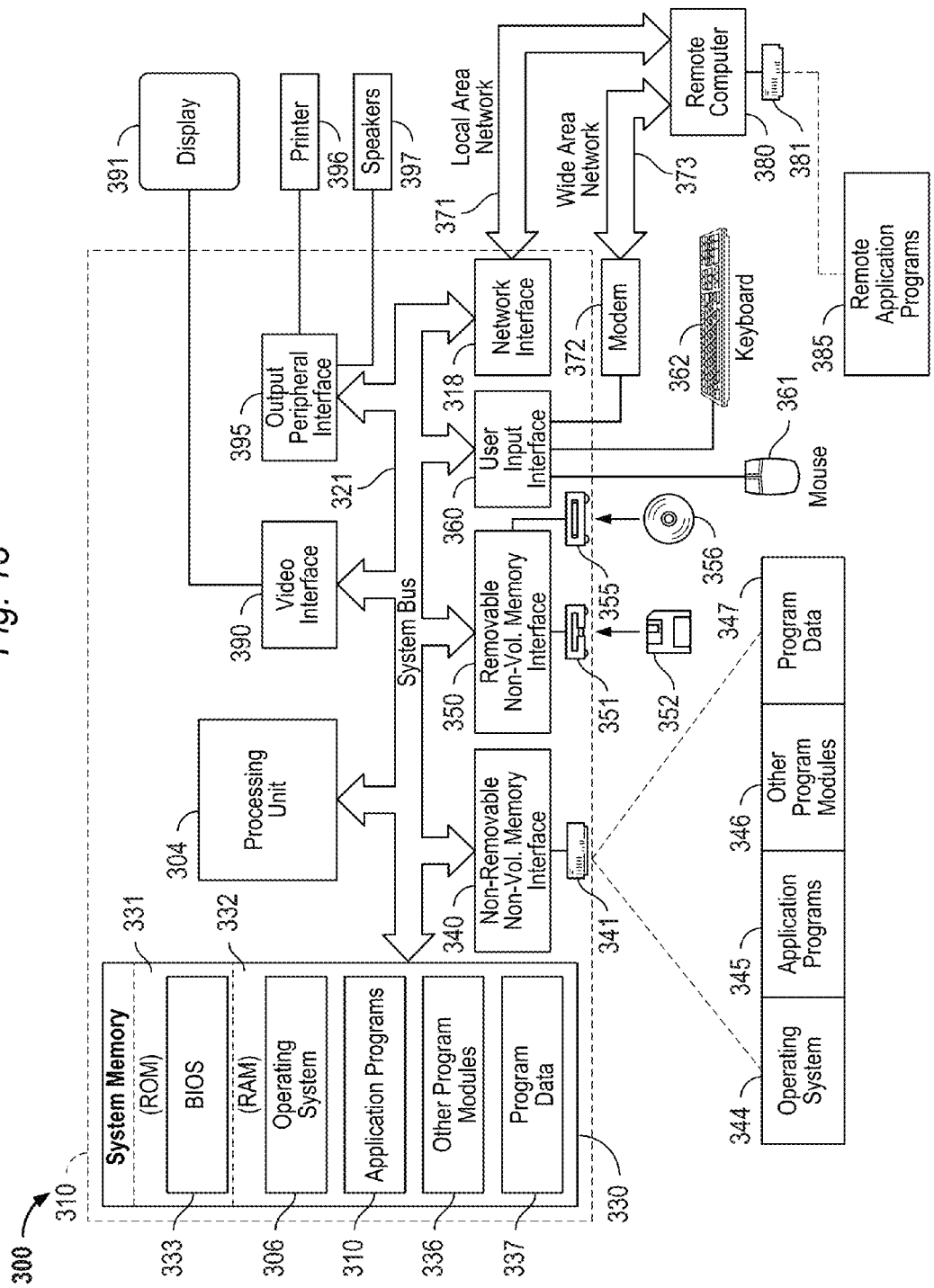
FIG. 13 is a block diagram of an illustrative computing system for implementing aspects of the present technology.

FIG. 13 illustrates a computing system 300 capable of executing the encoding and decoding portions of the continuous rounding routine, in hardware, software or a combination of the two. The computing system 300 may also transmit, store and/or receive encoded C values in accordance with the present technology. As noted above, enabling the computing system 300 to work with numbers which are properly rounded up or down when less than all bits are received improves the efficiency, accuracy and functionality of the computing system 300.

The computing system 300 is one example of a suitable computing environment and is not intended to suggest any limitation as to the scope of use or functionality of the present system. Neither should the computing system 300 be interpreted as having any dependency or requirement relating to any one or combination of components illustrated in the exemplary computing system 300.

The present system is operational with numerous other general purpose or special purpose computing systems, environments or configurations. Examples of well-known computing systems, environments and/or configurations that may be suitable for use with the present system include, but are not limited to, personal computers, server computers, multiprocessor systems, microprocessor-based systems, network PCs, minicomputers, hand-held computing devices, mainframe computers, and other distributed computing environments that include any of the above systems or devices, and the like. In the distributed and parallel processing cluster of computing systems used to implement the present system, tasks are performed by remote processing devices that are linked through a communication network. In such a distributed computing environment, program modules may be located in both local and remote computer storage media including memory storage devices.

With reference to FIG. 13, an exemplary computing system 300 for use in performing the above-described methods includes a general purpose computing device. Components of computing system 300 may include, but are not limited to, a processing unit 304, a system memory 316, and a system bus 321 that couples various system components including the system memory to the processing unit 304. The system bus 321 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

The system memory 316 includes computer storage media in the form of volatile and/or nonvolatile memory such as read only memory (ROM) 331 and random access memory (RAM) 332. A basic input/output system (BIOS) 333, containing the basic routines that help to transfer information between elements within computing system 300, such as during start-up, is typically stored in ROM 331. RAM 332 typically contains data and/or program modules that are immediately accessible to and/or presently being operated on by processing unit 304. By way of example, and not limitation, FIG. 13 illustrates operating system 306, application programs 310, other program modules 336, and program data 337.

The computing system 300 may also include other removable/non-removable, volatile/nonvolatile computer storage media. By way of example only, FIG. 13 illustrates a hard disk drive 341 that reads from or writes to non-removable, nonvolatile magnetic media, a magnetic disk drive 351 that reads from or writes to a removable, nonvolatile magnetic disk 352, and an optical disk drive 355 that reads from or writes to a removable, nonvolatile optical disk 356 such as a CD-ROM or other optical media. Other removable/non-removable, volatile/nonvolatile computer storage media that can be used in the exemplary operating environment include, but are not limited to, magnetic tape cassettes, flash memory cards, DVDs, digital video tape, solid state RAM, solid state ROM, and the like. The hard disk drive 341 is typically connected to the system bus 321 through a non-removable memory interface such as interface 340, and magnetic disk drive 351 and optical disk drive 355 are typically connected to the system bus 321 by a removable memory interface, such as interface 350.

The drives and their associated computer storage media discussed above and illustrated in FIG. 13 provide storage of computer readable instructions, data structures, program modules and other data for the computing system 300. In FIG. 13, for example, hard disk drive 341 is illustrated as storing operating system 344, application programs 345, other program modules 346, and program data 347. These components can either be the same as or different from operating system 306, application programs 310, other program modules 336, and program data 337. Operating system 344, application programs 345, other program modules 346, and program data 347 are given different numbers here to illustrate that, at a minimum, they are different copies.

A user may enter commands and information into the computing system 300 through input devices such as a keyboard 362 and pointing device 361, commonly referred to as a mouse, trackball or touch pad. Other input devices (not shown) may be included. These and other input devices are often connected to the processing unit 304 through a user input interface 360 that is coupled to the system bus 321, but may be connected by other interface and bus structures, such as a parallel port, game port or a universal serial bus (USB). A monitor 391 or other type of display device is also connected to the system bus 321 via an interface, such as a video interface 390. In addition to the monitor 391, computers may also include other peripheral output devices such as speakers 397 and printer 396, which may be connected through an output peripheral interface 395.

As indicated above, the computing system 300 may operate in a networked environment using logical connections to one or more remote computers in the cluster, such as a remote computer 380. The remote computer 380 may be a personal computer, a server, a router, a network PC, a peer device or other common network node, and typically includes many or all of the elements described above relative to the computing system 300, although only a memory storage device 381 has been illustrated in FIG. 13. The logical connections depicted in FIG. 13 include a local area network (LAN) 371 and a wide area network (WAN) 373, but may also include other networks. Such networking environments are commonplace in offices, enterprise-wide computer networks, intranets and the Internet.

When used in a LAN networking environment, the computing system 300 is connected to the LAN 371 through a network interface or adapter 318. When used in a WAN networking environment, the computing system 300 typically includes a modem 372 or other means for establishing communication over the WAN 373, such as the Internet. The modem 372, which may be internal or external, may be connected to the system bus 321 via the user input interface 360, or other appropriate mechanism. In a networked environment, program modules depicted relative to the computing system 300, or portions thereof, may be stored in the remote memory storage device. By way of example, and not limitation, FIG. 13 illustrates remote application programs 385 as residing on memory device 381. It will be appreciated that the network connections shown are exemplary and other means of establishing a communications link between the computers may be used.

In summary, embodiments of the present technology relate to a method for encoding a binary number for at least one of storage on a computing system and transmission from the computing system, comprising: (a) encoding the binary number into an encoded value, such that one or more high order bits that remain in the encoded value when one or more lower order bits are omitted always represent a correct rounding of the encoded value up or down to most accurately approximate the original binary number; and (b) performing at least one of storing the encoded value and transmitting the encoded value.

In further embodiments, the present technology relates to a computer readable storage medium for programming a processor of a computing system to perform a method of encoding an n-bit binary number, B, into an encoded value, C, for at least one of storing the encoded value on the computing system and transmitting the encoded value from the computing system, comprising: (a) setting a high order bit n in the encoded value C equal to a high order bit n−1 in the binary number B; (b) setting the middle bits $C_{n-1}$ through $C_1$ to the XOR of bits $B_{n-1}$ through $B_{n-2}$ respectively (c) setting the low order bit $C_0$ in the encoded value equal to the low order bit in the binary number $B_0$.

In other embodiments, the present technology relates to a method of decoding an encoded value, C, into a corresponding binary number, D, the binary number including n bits, the encoded value being transmitted from and/or stored on a computing system, the method comprising: (a) setting a high order bit $D_{n-1}$ of the binary number to the high order bit $C_n$ of the encoded value; and (b) obtaining remaining bits $D_{n-2:0}$ of the binary number by performing a sequential XOR of the bits $D_k$ with $C_k$ with k decreasing from n−2 to 1 in successive XOR operations.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. It is intended that the scope of the invention be defined by the claims appended hereto.

I claim:

1. A method for encoding a binary number for at least one of storage on a computing system and transmission from the computing system, comprising:
   (a) encoding the binary number into an encoded value for the purpose of representing a correct rounding of the encoded value up or down to approximate the original binary number after one or more lower order bits in the encoded value are omitted, said step (a) comprising the step of encoding the binary number into the encoded value, such that successive "1" bits in the encoded value, raised to their respective binary weights, are added to and subtracted from a sum to approach the original binary number; and
   (b) performing at least one of storing the encoded value and transmitting the encoded value.

2. The method of claim 1, said step (a) comprising the step of encoding the binary number into the encoded value, such that successive "1" bits in the encoded value, raised to their respective binary weights, are alternatingly added to and subtracted from the sum to approach the original binary number.

3. The method of claim 1, said step (a) comprising setting the high order bit in the encoded value equal to the high order bit in the binary number, and setting the low order bit in the encoded value equal to the low order bit in the binary number.

4. The method of claim 3, said step (a) further comprising the step of obtaining one or more intermediate bits in the encoded value between the high order bit and low order bit by XORing successive bits in the binary number with successive next order lower bits in the binary number.

5. The method of claim 1, said step (a) comprising the step of encoding an n-bit binary number into an n+1 bit encoded value.

6. The method of claim 1, said step (a) comprising the step of encoding the binary number into an encoded value having an even number of true bits.

7. The method of claim 6, wherein having an even number of "1" bits in the encoded value enables truncation of the low order bit in the encoded value such that the number of bits in the encoded value equals the number of bits in the binary number.

8. The method of claim 6, wherein having an even number of "1" bits in the encoded value enables the low order bit in the encoded value to be used as a parity bit to verify correct transmission or storage of the encoded value.

9. A computer readable storage medium for programming a processor of a computing system to perform a method of encoding an n-bit binary number, B, into an encoded value, C, for at least one of storing the encoded value on the computing system and transmitting the encoded value from the computing system, comprising:
(a) setting a high order bit n in the encoded value C equal to a high order bit n−1 in the binary number B;
(b) setting the middle bits $C_{n-1}$ through $C_1$ to the XOR of bits $B_{n-1}$ through $B_{n-2}$ respectively; and
(c) setting the low order bit in the encoded value equal to the low order bit in the binary number.

10. The method of claim 9, said steps (a), (b) and (c) comprising the step of encoding the n-bit binary number into an n+1 bit encoded value.

11. The method of claim 9, said step (a) comprising the step of encoding the binary number into an encoded value having an even number of "1" bits.

12. The method of claim 11, further comprising the step of truncating the low order bit in the encoded value such that the number of bits in the encoded value equals the number of bits in the binary number.

13. The method of claim 12, further comprising the step of deriving the truncated low order bit $C_0$ in the encoded value by performing an XOR of the bits $C_n$ through $C_1$.

14. The method of claim 11, further comprising the step of verifying the encoded value using parity to check the number of "1" bits in the encoded value.

15. A method of decoding an encoded value, C, into a corresponding binary number, D, the binary number including n bits, the encoded value being transmitted from and/or stored on a computing system, the method comprising:
(a) setting a high order bit $D_{n-1}$ of the binary number to the high order bit $C_n$ of the encoded value; and
(b) obtaining remaining bits $D_{n-2:0}$ of the binary number by performing a sequential XOR of the bits $D_k$ with $C_k$ with k decreasing from n−2 to 1 in successive XOR operations.

16. The method of claim 15, wherein the number of bits in the encoded value that is decoded is equal to the number of bits in the corresponding binary number.

17. The method of claim 15, wherein the number of bits in the encoded value that is decoded has one greater number of bits than the corresponding binary number.

18. The method of claim 15, wherein the lowest order bit in the encoded value that is decoded is disregarded in step (b).

19. The method of claim 15, further comprising a step (c) in the event the initial encoded value is missing one or more bits, said step (c) comprising a post-rounding routine to further refine the corresponding binary number to further limit the maximum difference between the original and decoded values.

20. The method of claim 15, wherein the binary number obtained by the decoding of the encoded value is equal to a second binary number which is encoded into the encoded value, where the encoded value has at least as many bits as the second binary number.

21. A computing system, comprising:
a processor for encoding a binary number into an encoded value for the purpose of representing a correct rounding of the encoded value up or down to approximate the binary number after one or more lower order bits in the encoded value are omitted, the processor encoding the binary number into the encoded value, such that successive "1" bits in the encoded value, raised to their respective binary weights, are added to and subtracted from a sum to approach the original binary number; and
a storage medium for storing the encoded value.

22. The computing system of claim 21, the processor encoding the binary number into the encoded value, such that successive "1" bits in the encoded value, raised to their respective binary weights, are alternatingly added to and subtracted from the sum to approach the original binary number.

23. The computing system of claim 21, wherein the binary number is an n-bit binary number, B, the processor encoding the n-bit binary number B into the encoded value, C, by: a) setting a high order bit n in the encoded value C equal to a high order bit n−1 in the binary number B; b) setting the middle bits $C_{n-1}$ through $C_1$ to the XOR of bits $B_{n-1}$ through $B_{n-2}$ respectively; and c) setting the low order bit in the encoded value equal to the low order bit in the binary number.

24. The computing system of claim 21, further comprising a network connection for transmitting the encoded value to a second computing system separate from the first computing system.

25. The computing system of claim 21, the processor further receiving a second encoded value, and the processor decoding the second encoded value into a second binary number which accurately approximates the first binary number for the number of bits in the second encoded value received.

26. The computing system of claim 21, the processor further receiving a second encoded value, C, and the processor decoding the second encoded value C into a second binary number, D, including n bits, by: a) setting a high order bit $D_{n-1}$ of the binary number to the high order bit $C_n$ of the encoded value; and b) obtaining remaining bits $D_{n-2:0}$ of the binary number by performing a sequential XOR of the bits $D_k$ with $C_k$ with k decreasing from n−2 to 1 in successive XOR operations.

27. A computing system, comprising:
a processor for encoding a binary number into an encoded value for the purpose of representing a correct rounding of the encoded value up or down to approximate the binary number after one or more lower order bits in the encoded value are omitted, the processor encoding an n-bit binary number into an n+1 bit encoded value; and
a storage medium for storing the encoded value.

28. The computing system of claim 27, the processor encoding the binary number into the encoded value, such that successive "1" bits in the encoded value, raised to their respective binary weights, are alternatingly added to and subtracted from a sum to approach the original binary number.

29. A computing system, comprising:
a processor for encoding a binary number into an encoded value for the purpose of representing a correct rounding of the encoded value up or down to approximate the binary number after one or more lower order bits in the encoded value are omitted, the processor encoding the binary number into an encoded value having an even number of true bits; and a storage medium for storing the encoded value.

30. The computing system of claim 29, the processor encoding the binary number into the encoded value, such that successive "1" bits in the encoded value, raised to their respective binary weights, are alternatingly added to and subtracted from a sum to approach the original binary number.

\* \* \* \* \*